United States Patent [19]
Pasch

[11] Patent Number: 5,247,153
[45] Date of Patent: Sep. 21, 1993

[54] METHOD AND APPARATUS FOR IN-SITU DEFORMATION OF A SURFACE, ESPECIALLY A NON-PLANAR OPTICAL SURFACE

[75] Inventor: Nicholas F. Pasch, Pacifica, Calif.

[73] Assignee: LSI Logic Corporation, Milpitas, Calif.

[21] Appl. No.: 711,077

[22] Filed: Jun. 6, 1991

Related U.S. Application Data

[63] Continuation-in-part of Ser. No. 418,548, Oct. 5, 1989, Pat. No. 5,055,871.

[51] Int. Cl.$^5$ .............................................. B23K 26/00
[52] U.S. Cl. .......................... 219/121.68; 219/121.69; 219/121.83
[58] Field of Search ............... 219/121.68, 121.69, 219/121.83; 356/394

[56] References Cited

U.S. PATENT DOCUMENTS

| | | | |
|---|---|---|---|
| 3,943,278 | 3/1976 | Ramsey, Jr. | 356/394 X |
| 4,290,698 | 9/1981 | Milana | 356/394 X |
| 4,297,034 | 10/1981 | Ito et al. | 356/394 |
| 4,960,320 | 7/1990 | Taniura | 350/171 |
| 4,960,322 | 10/1990 | Khoshnevisan et al. | 350/354 |
| 4,960,327 | 11/1990 | Sekine | 351/221 |
| 4,960,332 | 4/1990 | Földi et al. | 356/376 |
| 4,961,646 | 2/1990 | Schrämmli et al. | 356/328 |
| 4,969,737 | 7/1990 | Humbel et al. | 356/124 |
| 4,984,883 | 9/1991 | Winocur | 351/212 |
| 4,984,886 | 3/1991 | Yoshida | 356/237 |
| 4,985,618 | 2/1991 | Inada et al. | 250/208.1 |
| 5,149,936 | 9/1992 | Walton, II | 219/121 X |

*Primary Examiner*—C. L. Albritton
*Attorney, Agent, or Firm*—Gerald E. Linden; Michael D. Rostoker

[57] ABSTRACT

The surface of an optical element, such as the taking lens in semiconductor photolithographic apparatus, is deformed, in situ, by applying heat to the surface. A recipe for applying the heat to a selected area of the lens surface is developed by either measuring the image projected by the lens and comparing the measured image to the specified (mask) image, or by measuring the contour of the surface of the lens and comparing the measured contour to the lens' specified contour. The heat is applied by a laser, the output of which is focussed and scanned onto the surface of the lens. Method and apparatus are disclosed.

20 Claims, 2 Drawing Sheets

METHOD AND APPARATUS FOR IN-SITU DEFORMATION OF A SURFACE, ESPECIALLY A NON-PLANAR OPTICAL SURFACE

CROSS-REFERENCE TO RELATED APPLICATIONS

This is a continuation-in-part of copending, commonly-owned U.S. Pat. application No. 418,548, entitled METHOD AND APPARATUS FOR ENHANCING ILLUMINATION UNIFORMITY IN WAFER STEPPERS USING PHOTOCHROMIC GLASS IN THE OPTICAL PATH and filed Oct. 5, 1989 by Pasch, now U.S. Pat. No. 5,055,871.

TECHNICAL FIELD OF THE INVENTION

The present invention relates to techniques for effectively reshaping the curvature of non-planar surfaces, such as surfaces of an optical element, and, more particularly to the in-situ deformation of lenses, such as in semiconductor photolithographic apparatus.

BACKGROUND OF THE INVENTION

Because of manufacturing defects, mounting strains, and environmental (e.g., temperature) changes, many optical systems perform in the field in a manner inferior to the system design and original construction. A notorious example of this is the Hubble Space Telescope.

On a more down to earth level, photolithography equipment, such as that used in the manufacture of semiconductor devices, provides an example of optical equipment which typically performs in a degraded manner in actual usage. Small deviations from the design specification will lead to errors which, although seemingly small, can represent a substantial contribution to the overall error budget allowed for the manufacture of these intricate devices.

More particularly, the "taking" (imaging) lens of semiconductor photolithographic apparatus must exhibit especially high imaging quality. In use, however, the image will tend to be somewhat degraded, often in unpredictable ways. This is often attributable to the shape, or curvature of the taking lens deviating from its design specification and/or original construction. Persistent, endemic problems can be detected by conventional gauging equipment, such as may be used in acceptance testing of the lens or at a later time to verify the continued proper performance of the lens. (See, e.g., U.S. Pat. No. 4,984,886.) The remedy for this class of problems is simply to exchange the lens for one which better matches the design specification, but this can represent an unwelcome expense and, more importantly, a major interruption in the up-time of a system.

When an optical element, such as a lens or mirror, is exhibiting sporadic degradation of imaging quality, in use, the problem can be inconsistent, harder to diagnose and somewhat elusive.

DISCLOSURE OF THE INVENTION

It is therefore an object of the present invention to provide a technique for remedying image degradation caused by or capable of being corrected by an optical element, in situ, without removing the optical element from service.

It is a further object of the present invention to provide a technique for what amounts to effectively reshaping the taking lens of semiconductor photolithographic apparatus, in situ.

According to the invention, the imaging quality of an optical element is monitored, in situ, in an optical system. The imaging quality can be measured during use or between usages. Deviations from specified ("target") performance are detected, and correlated to apparent anomalies (defects) in the shape (contour) of the surface. The deviations are tabulated, and a "recipe" for correcting the defects is developed. Heat is applied selectively to the area containing the apparent anomaly, causing that area to expand, in a predictable manner, according to the correction recipe, until the lens exhibits desired (specified) imaging quality. In the main, hereinafter, lenses are discussed as exemplary optical elements, but the techniques are applicable to other optical elements such as mirrors.

According to an aspect of the invention, the heat source is a focusable source of heat, such as an infrared (IR) laser, which can be focussed onto and scanned across an arbitrarily chosen area of the lens surface. The heat source is able to cause the selective deformation of the lens surface by changing its temperature. This has the effect of expanding the lens and changing the optical path of a light rays passing through the lens.

The degraded image can be attributed to the lens itself, or to defects in an upstream optical element. In the latter case, the image can also be corrected by reshaping the lens surface.

In this manner, a system which is performing at less than its specified performance can be improved in the field. It further allows the optical system to be corrected while it is in use.

In the case of a defect in an upstream optical element, a zero strength (power) corrector can be incorporated into the optical train, monitored and deformed to correct for an upstream anomaly. Preferably, the corrector would have a high coefficient of refractive index change with temperature. Such a corrector would be very useful in correcting for "bumps" in upstream optical elements.

According to a further aspect of the invention, separate measuring means may be employed to gauge the performance of the lens, and its subsequent improvement, or the imagery of the system itself can be used to gauge the improvement.

Alternatively, the actual contour of the lens can be measured and compared against its specified contour, and deviations can be corrected by focussing and scanning the laser beam across a selected area of the surface of the lens.

Other objects, features and advantages of the invention will become apparent in light of the following description thereof.

DETAILED DESCRIPTION OF THE INVENTION

Figure 1:
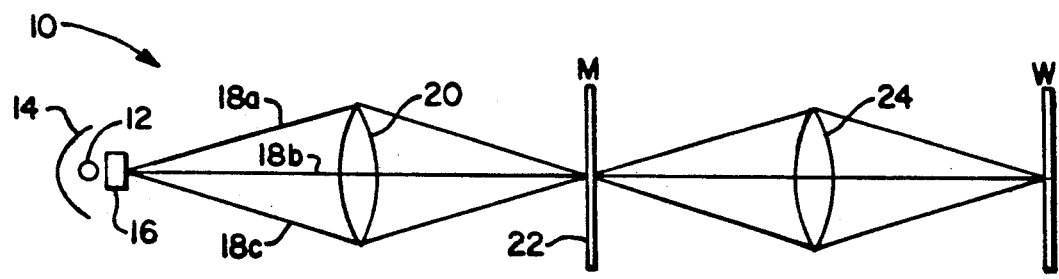
FIG. 1 is a simplified schematic representation of a prior art photolithographic apparatus.

FIG. 1 shows prior art lithographic apparatus 10 for exposing a semiconductor wafer (W), more particularly a coating thereon, to light. An optical path is defined from left to right in the figure. Prior to exposure, the semiconductor wafer (W) typically receives on its front surface a layer of photoreactive material (not shown), such as photoresist.

A light source 12 emits actinic light, and may be backed up by a reflector 14. Light emitted by the light source typically passes through a uniformizer 16, such as a fly's eye" lens or a light pipe.

Light exiting the uniformizer 16 is represented by rays 18a, 18b and 18c, and passes through a condensor lens 20. The ray 18b represents the optical axis of the photolithographic apparatus. The light source 12, reflector 14, uniformizer 16 and condensor lens 20 form what is termed an "illuminator" which is often detachable as a unit from the photolithographic apparatus.

A mask 22 (M) is disposed downstream of the condensor lens, at the focal point (plane) thereof. One type of mask used in photolithography is a chromed glass or quartz plate bearing a pattern to be projected onto the wafer (W). In lieu of a "mask", a "reticle" can be substituted to project a series of mask images onto the wafer.

Further downstream along the optical path, the rays diverge from the mask, and pass through a "taking" (imaging) lens 24. Because of its imaging function, the taking lens is of relatively high quality (precision, material), as compared with the condensor lens 20, and must be capable of projecting an extremely high quality image of a pattern on the mask onto the wafer. The mask 22 is disposed at a common focal point for the two lenses, and the wafer (W) is disposed at the downstream focal plane, or image plane, of the taking lens 24.

FIG. 1 is set forth as being exemplary of typical photolithographic apparatus. The present invention is applicable to any such apparatus having a lens, such as the photolithographic apparatus disclosed in the above-referenced commonly-owned, copending U.S. Pat. application Ser. No. 418,548, entitled METHOD AND APPARATUS FOR ENHANCING ILLUMINATION UNIFORMITY IN WAFER STEPPERS USING PHOTOCHROMIC GLASS IN THE OPTICAL PATH and filed on Oct. 5, 1989 by Pasch, incorporated by reference herein.

Figure 2:
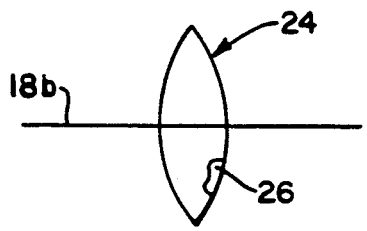
FIG. 2 is a simplified schematic representation of a taking lens illustrated in FIG. 1.

FIG. 2 shows the taking lens 24 of FIG. 1, and a "defect" (anomaly) 26 is exhibited on a surface of the lens. The defect 26 is shown greatly exaggerated for illustrative clarity, and can include flat spots, hollows, and the like, all of which can be grouped together as a class of defects wherein the local surface contour of the lens at a specified area is depressed below the specified curvature of the lens surface for that area. As mentioned above, such defects are especially intolerable in the taking lens of semiconductor photolithographic apparatus, as they will contribute enormously to an already tight error budget.

Figure 3:
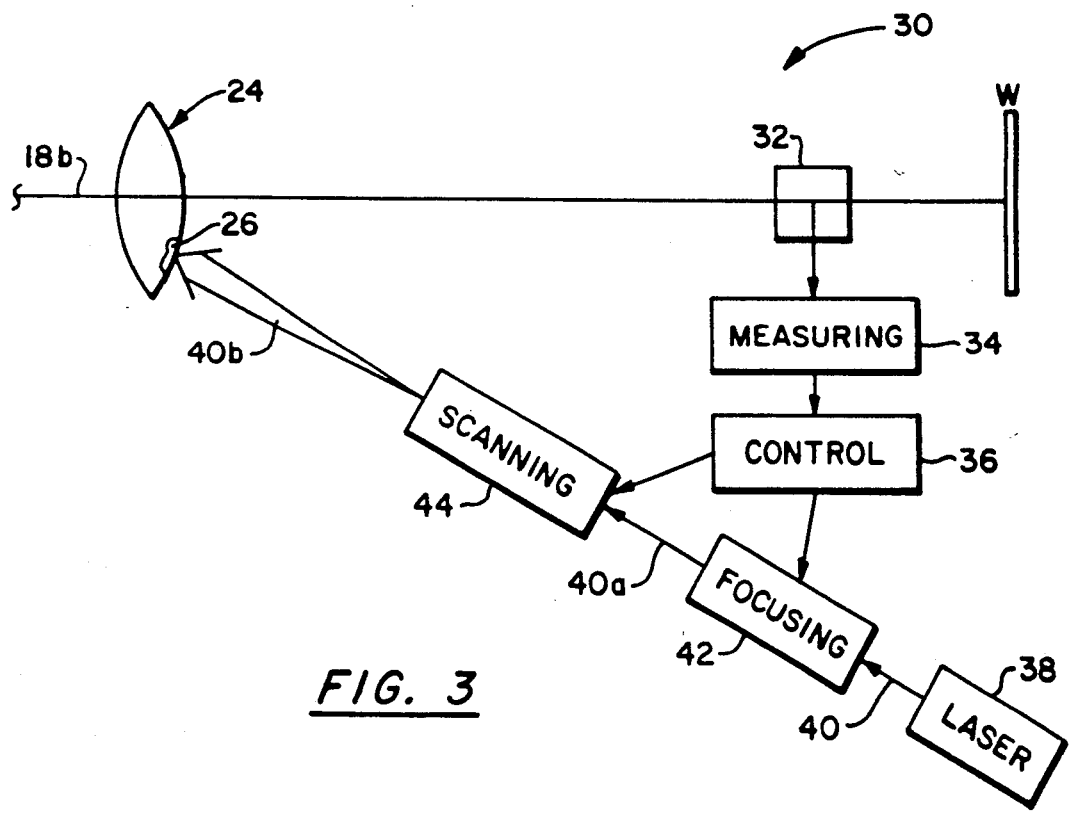
FIG. 3 is a simplified schematic representation of a system for in situ deformation of a surface of the taking lens of FIG. 2, illustrating the inventive technique of the present invention.

FIG. 3 shows a system 30 for performing the selective deformation technique of the present invention. The optical ray 18b is shown entering the lens 24 from the left, which would be after the mask 22 shown in FIG. 1. As in FIG. 2, the taking lens 24 of a semiconductor photolithographic apparatus exhibits an anomaly 26.

A beam-splitter 32 is disposed downstream of the lens 24 to allow (with appropriate additional optics for focussing, not illustrated) the mask image to be monitored by a measuring device. 34. The measured (actual) mask image is compared with the specified mask image (which is precisely known), and any deviations between the measured and specified images are noted and tabulated in a suitable computer, labeled "Control" 36. These deviations are readily attributable to an anomaly in the contour of the lens 24, in the case of a single optical element in the system. Or, in a more complex optical system, the deviations may be attributable to a defect in an upstream optical element. In either case, the defect can be corrected by what amounts to a re-shaping of the lens 24 (i.e., of a single optical element, even in a system employing several optical elements).

The specified contour of the lens 24 is known, and it is assumed that the image quality would be perfect (zero deviation of measured versus specified images), if the lens exhibited the specified contour. Based on this assumption, a recipe for reshaping, or selectively deforming the lens 24 is developed. Preferably, such reshaping will only be necessary in the area of the anomaly 26.

A focusable heat source, such as an infrared laser 38, is provided for heating a selected area on the lens containing the anomaly, thereby causing that area to swell (expand) and resume the specified contour of the lens surface. In this example, the laser outputs a beam 40. The laser preferably operates in the infrared range, which is suitable for heating the material of a lens (glass, quartz or the like). Wavelength and power, as well as continuous (CW) or pulsed laser operation, are selected to provide heating without ablation of the lens surface.

A focussing system 42, comprising lenses, variable apertures and the like, is provided for controlling the spot size (cross-sectional area) and shape (cross-sectional profile) of the beam 40, which is shown at 40a exiting the focusing system. The focusing system 42 is under the control of the computing system 36, and the beam spot size and shape is developed from the correction recipe.

A scanning system 44 directs the beam 40a to the area of the lens needing correction. The output of the scanning system is thus shown as a divergent beam 40b. The scanning system 44 is also under the control of the computing system 36, and the scan area and dwell time on any particular spot within the scan area is developed from the correction recipe.

The scanning and focussing systems will direct the laser beam to the location on the lens to be heated on a schedule which will allow the area to remain most nearly constant in temperature. This is not difficult, since typical optical materials are either dielectric or glass materials which do not change temperature rapidly.

This will deform the surface of the lens 24 to a contour that more nearly corrects the wave form (i.e., mask image) to be imaged or transmitted. The scanning pattern can be chosen to correct for either radially symmetric lens deformations or for local deformations in the lens (or mirror). The ability to correct for either of these problems with the same tool is both unusual and useful.

The heat beam spot (i.e., beam 40b as it falls upon the lens 24) can be of arbitrary size and even shape. The fact that it can be made small or large can cause it to correct for both deformations of small area extent and also gradual deformations across the entire area of the lens or mirror surface.

The system 30 is a closed loop system, and can be constructed such that the image can be examined as the target lens (or mirror) is selectively deformed. In this way, the projected image itself is used to selectively "tune" the optical train to best performance.

Figure 4:
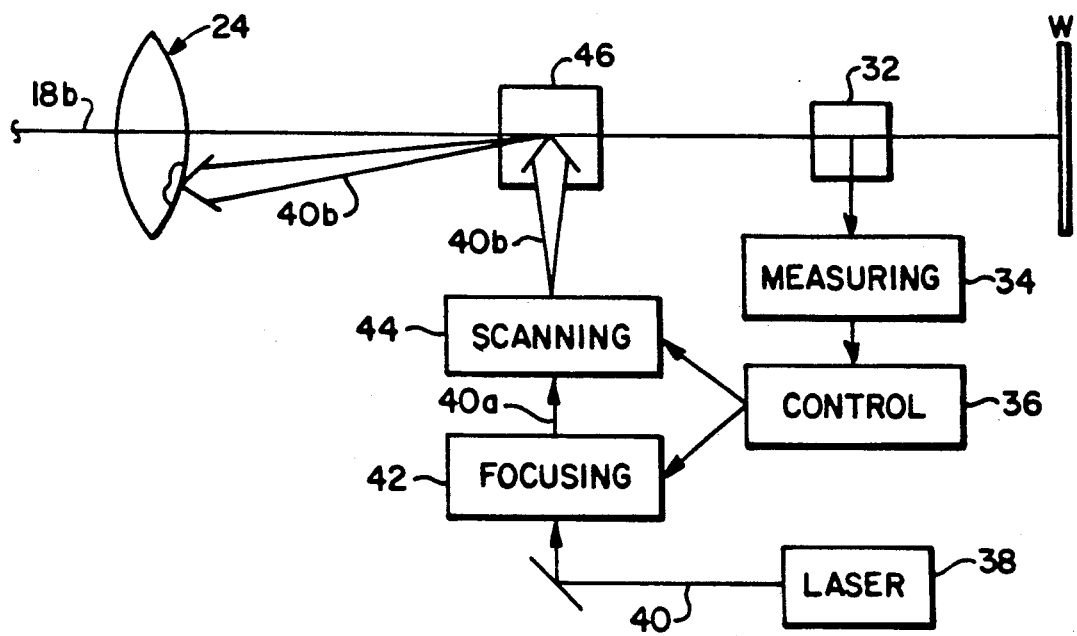
FIG. 4 is a simplified schematic representation of an alternate embodiment of the technique of the present invention.

The laser beam can be directed to the optical surface either obliquely, as shown in FIG. 3, or on-axis by means of an additional beamsplitter 46, as illustrated in FIG. 4.

As mentioned above, it is also possible that the defect is not in the optical element (e.g., 24) being selectively deformed (e.g., heated)—that in the case of a more complex optical train, the degradation of image quality may be caused by an upstream optical element. Nevertheless, the degradation can be remedied by altering the surface contour of a single optical element (e.g., 24), preferably the most downstream optical element.

Suitable lasers for the application described above are well known and readily available. Suitable beamsplitters, focussing systems, and scanning systems are also well known, and readily available. (See, e.g., U.S. Pat. No. 4,960,327.) One skilled in the art will readily recognize the criteria for suitably programming the computer 36 to develop a recipe for selectively deforming an optical element, as taught herein, based on the difference between measured and specified image quality, and on the particular laser, scanning system and focusing system selected for employing the invention.

In the example provided above, the imaging quality of the lens is taken as the criteria for directly evaluating the performance of the lens 24. As discussed, the mask image projected onto the wafer can be detected (via beamsplitter 32) and compared with the known (design) mask image.

Figure 5A:
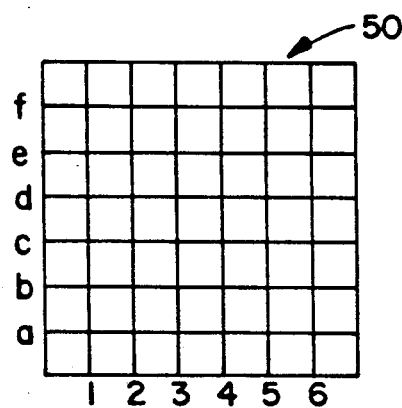
FIGS. 5A and 5B are graphic representations of a specified image and measured image, respectively, according to the present invention.
Figure 5B:
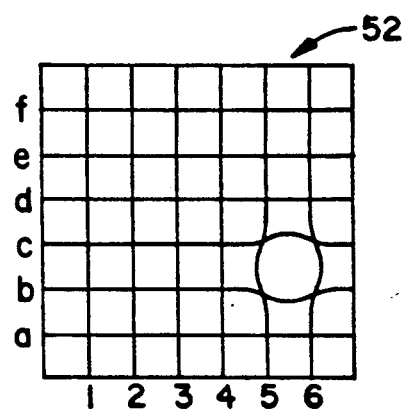

FIGS. 5A and 5B are illustrative of comparing specified to measured images. FIG. 5A shows a generic grid pattern 50 comprising a number of row lines a-f and orthogonal column lines 1-6, and this represents the "specified" mask image. FIG. 5B shows the mask image 52 as detected by the measuring equipment 34 (FIGS. 3 and 4). As shown in FIG. 5B, it is readily apparent that there is an anomaly in the lens 24 causing distortion in the area bounded by rows c-d and columns 5-6. It is a relatively straightforward matter to determine, based on a comparison of the measured image 52 to the specified image 50, that there is an anomaly (26) in the lens (24). And, it is similarly straightforward to develop a recipe (in 36) for correcting the anomaly. And, as mentioned above, as the area of the anomaly 26 is heated, according to the recipe, the performance of the lens can continuously be monitored until the measured image 52 most nearly matches the specified image 50.

As mentioned above, the contour of the lens can be indirectly measured and monitored, in situ and in use, by monitoring an image projected through the lens. Alternatively, the contour of the lens can be directly measured, and corrected for anomalies, with the expectation that image quality will be improved commensurately. In this case, apparatus is provided for measuring the contour of the lens, directly, and this measured contour is compared against the specified contour to develop the correction recipe. Such apparatus for measuring the contour of non-planar optical elements is well known and is used, for instance, in keratometry. (See, e.g., U.S. Pat. Nos. 4,984,883 and 4,960,332.)

As mentioned above, a benefit of the inventive technique disclosed herein is that the performance of an optical element can be monitored and corrected, in situ. And, as mentioned above, it can be monitored in use (i.e., simultaneously with use) or between use (i.e., by alternating using the lens with measuring and correcting its contour).

What is claimed is:

1. A method of selectively correcting an anomaly in a surface, comprising:
   establishing a specified contour for a surface;
   measuring the contour of the surface;
   determining that there is a deviation of the measured contour from the specified contour;
   calculating correction parameters for deforming the surface so that the deviation will be reduced; and
   deforming the surface so that the deviation will be reduced;
   wherein: the surface is a surface of a lens.

2. A method according to claim 1, wherein:
   surface is deformed by applying a focusable source of heat to a selected area of the surface.

3. A method according to claim 2, wherein:
   the focusable source of heat is a laser beam.

4. A method according to claim 3, wherein:
   the laser beam is sized and shaped to heat the selected area of the surface.

5. A method according to claim 4, wherein:
   the laser beam is introduced obliquely to the surface of the lens.

6. A method according to claim 4, wherein:
   the laser beam is introduced on-axis to the surface of the lens.

7. A method according to claim 4, wherein:
   the lens is the taking lens of semiconductor photolithographic apparatus.

8. A method according to claim 7, wherein:
   the contour of the surface is measured during semiconductor fabrication in the photolithographic apparatus; and
   the laser beam is scanned across the anomaly during semiconductor fabrication in the photolithographic apparatus.

9. A method of in situ correction of imaging quality in an optical system including a lens, comprising:
   specifying an image for projecting through a lens;
   measuring the image as projected by the lens;
   comparing the specified image to the measured image;
   developing a correction recipe based on any deviations between the specified image and the measured image; and
   deforming a surface of the lens according to the correction recipe.

10. A method according to claim 9, wherein:
    a laser beam is focussed and scanned onto the surface of the lens to deform the surface of the lens.

11. A method according to claim 9, wherein:
    the lens is the taking lens of semiconductor photolithographic apparatus.

12. A method according to claim 11, wherein:
    the image is measured during semiconductor fabrication.

13. Semiconductor lithographic apparatus including a taking lens, comprising:
    means for measuring the imaging quality of the taking lens;

means for determining that there is a degradation in imaging quality that can be corrected by reshaping a surface of the taking lens;

means for developing a recipe for reshaping the taking lens; and means for reshaping the surface of the lens to reduce the degradation in imaging quality.

14. Apparatus according to claim 13, wherein:

the means for reshaping the surface of the lens comprises:

a laser beam;

a focusing system; and a scanning system.

15. Apparatus according to claim 13, wherein:

the degradation in imaging quality is directly attributable to a defect in the surface of the taking lens.

16. A method of in situ correction of imaging quality in an optical system, comprising:

incorporating a zero strength corrector into the optical system:

specifying an image for projecting through the corrector;

measuring the image passing through the corrector;

comparing the specified image to the measured image;

developing a correction recipe based on any deviations between the specified image and the measured image; and deforming a surface of the corrector according to the correction recipe.

17. Method, according to claim 16, wherein:

the surface is deformable by applying a focusable source of heat to a selected area of the surface.

18. Method according to claim 17, wherein:

the focusable source of heat is a laser beam.

19. Method, according to claim 16, wherein:

the optical system is a semiconductor photolithographic apparatus.

20. Method, according to claim 19, wherein:

the image is measured during semiconductor fabrication in the photolithographic apparatus; and the surface is deformed during semiconductor fabrication in the photolithographic apparatus.

* * * * *